United States Patent [19]

Annett

[11] Patent Number: 5,144,533
[45] Date of Patent: Sep. 1, 1992

[54] SELF-LOCKING HOUSING ASSEMBLY

[75] Inventor: Thomas A. Annett, Arlington Heights, Ill.

[73] Assignee: Motorola, Inc., Schaumburg, Ill.

[21] Appl. No.: 722,442

[22] Filed: Jun. 27, 1991

[51] Int. Cl.⁵ .............................................. H05K 1/14
[52] U.S. Cl. ................... 361/395; 361/392; 361/394; 361/399; 361/412; 312/223.1
[58] Field of Search ............... 361/392, 395, 399, 394, 361/412, 415; 312/208, 223

[56] References Cited

U.S. PATENT DOCUMENTS 4,896,777  1/1990  Lewis ................................. 211/41
5,036,313  7/1991  Lin et al. ............................ 340/700

OTHER PUBLICATIONS

Penn Engineering & Manufacturing Corp., Catalog, entitled "Snap Top (tm) Stan Offs", Bulletin SSA-689, 1985 & 1987.

Primary Examiner—Leo P. Picard
Assistant Examiner—Young S. Whang
Attorney, Agent, or Firm—Robert H. Kelly

[57] ABSTRACT

A housing assembly for supportively housing a circuit board in fixed engagement therewithin. The housing assembly forms a support surface for receiving the circuit board at an unlocked posiiton. Sliding translation of the circuit board is permitted upon the support surface to position the circuit board at a locked position. Translation of the circuit board causes elastic deformation of clamps which exert clamping forces responsive thereto to affix the circuit board in position at the locking position.

22 Claims, 6 Drawing Sheets

SELF-LOCKING HOUSING ASSEMBLY

BACKGROUND OF THE INVENTION

The present invention relates generally to housing structures which house electrical circuits, and, more particularly, to a housing assembly for supporting a circuit board in a fixed engagement therewithin.

Electrical devices typically include electrical circuits disposed upon one or more circuit boards. Circuit boards are utilized to facilitate connection of various, discrete components which, when suitably connected theretogether, form the electrical circuits. Frequently, circuit paths are etched upon the circuit board to form a printed circuit board. These circuit paths facilitate the formation of solder connections between the discrete electrical components.

The circuit boards are typically housed within a housing to prevent damage to the electrical circuit, and, also, to support the circuit board in position thereby. Typically, a circuit board includes either (or both) discrete components or circuit paths disposed upon both top and bottom surfaces thereof. Conventionally, the circuit board is affixed in position by the use of one or more threaded shaft members interconnecting the circuit board and the housing.

When threaded shaft members are utilized to affix a circuit board in position within a supportive housing, apertures formed through the circuit board must be precisely aligned with corresponding apertures formed in the housing to permit insertion of the threaded shaft members therein. Slight relative misalignment of the circuit board and the housing can result in improper, or even prevent, affixation of the circuit board to the housing. Misalignment of the circuit board and the housing can even result in damage to the circuit board and/or the housing.

Care must therefore be exercised to ensure proper alignment of the circuit board and the housing. Such use of threaded shaft members, as a result, is both labor intensive and time consuming.

Attempts have been made to permit affixation of a circuit board to a housing by other means. For instance, devices known as standoffs are available which permit affixation of a circuit board to a housing without the use of threaded shaft members. Such standoffs are constructed by, for example, Penn Engineering and Manufacturing Corporation, of type numbers SSA, SSC, and KSSB. While such standoffs obviate the need for use of threaded shaft members to affix the circuit board to the housing, apertures must be formed in both the housing and the circuit board to permit insertion of portions of the standoffs therethrough. Precise alignment of the circuit board with the housing assembly is still required to permit the affixation of the circuit board to the housing. Use of such standoffs, while obviating the need for threaded shaft members, still requires assembly steps to affix the standoffs to the housing.

As any decrease in the time required to affix the circuit board to a housing reduces the assembly time, and, hence, reduces assembly cost, any means by which a circuit board may be more easily affixed to a housing would be beneficial.

What is needed, therefore, is a housing assembly of a construction which simplifies the manner in which a circuit board may be supportively housed in fixed engagement therein.

SUMMARY OF THE INVENTION

The present invention, therefore, advantageously provides an improved housing assembly for supportively housing a substrate, such as a circuit board, in fixed engagement therein.

The present invention further advantageously provides a housing assembly construction which obviates the need for threaded shaft members or standoffs to affix a circuit board thereto.

The present invention includes further advantages and features, the details of which will become more apparent by reading the detailed description of the preferred embodiments hereinbelow.

In accordance with the present invention, therefore, a housing assembly for supportively housing a substrate in fixed engagement at a predetermined distance above a bottom surface thereof is disclosed. The housing assembly comprises a support surface for receiving the substrate thereupon. The support surface formed thereby is of dimensions permitting limited sliding translation of the substrate when positioned thereupon between an unlocked position and a locked position. At least one rib member aligns the substrate with the support surface for positioning of the substrate at the unlocked position upon initial positioning of the substrate upon the support surface. A clamp clamps the substrate in the fixed engagement when the substrate is translated to the locked position.

BRIEF DESCRIPTION OF THE DRAWINGS

The present invention will be better understood when read in light of the accompanying drawings in which.

DESCRIPTION OF THE PREFERRED EMBODIMENTS

Figures 1, 2, 6A, 6B, 7:
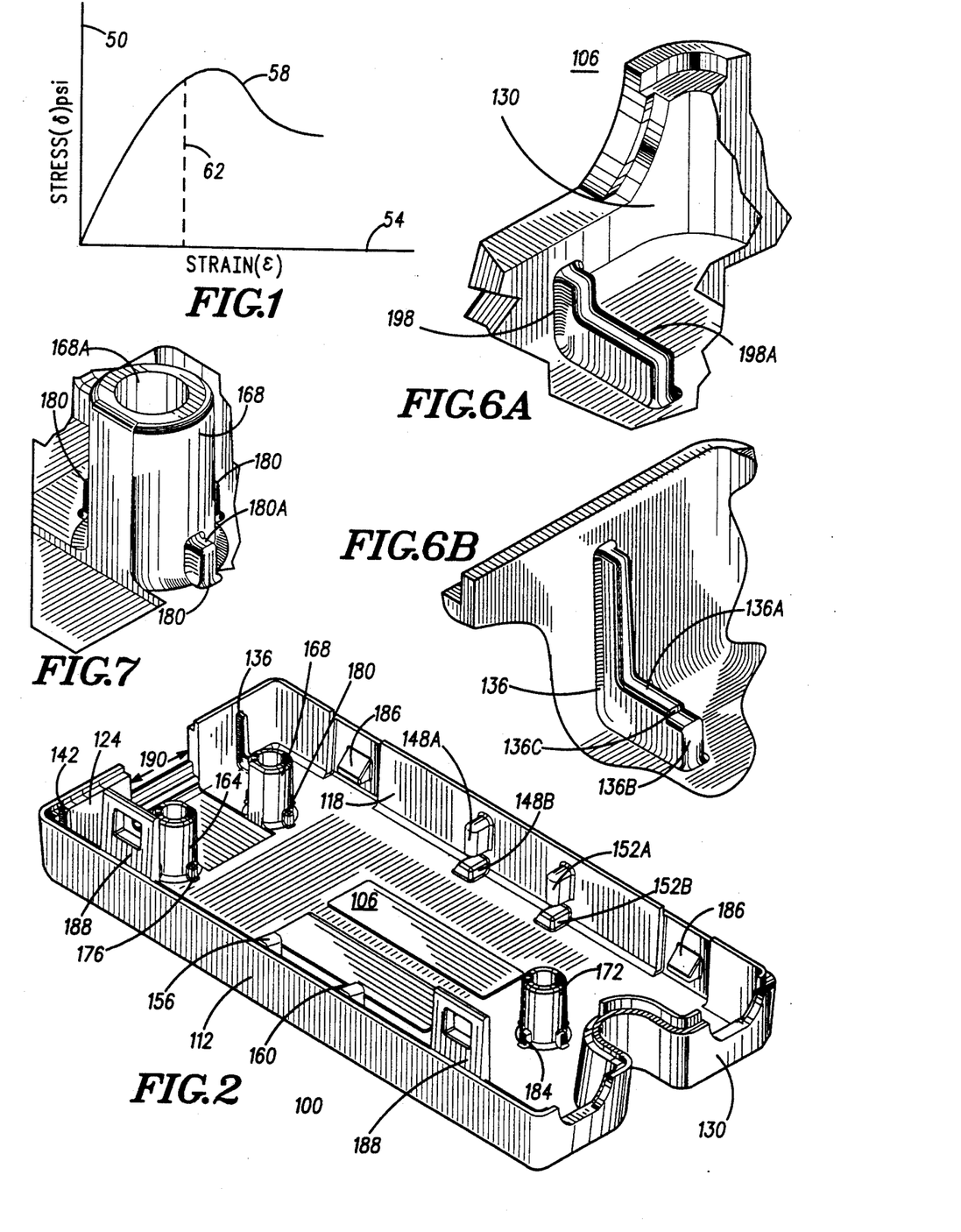
FIG. 1 is a graphical representation of the relationship between stress ($\sigma$) and strain ($\epsilon$) of an elastically-deformable material, such as a thermoplastic material.
FIG. 2 is a perspective view of the housing assembly of the preferred embodiment of the present invention taken from a first angle.
FIG. 6A is an enlarged, cutaway view of a single, shoulder portion forming a portion of the housing assembly of the preferred embodiment of the present invention.
FIG. 6B is an enlarged, cutaway view of another shoulder portion of the housing assembly forming a portion of the preferred embodiment of the present invention.
FIG. 7 is an enlarged, cutaway view of a single, truncated cylinder and shoulder portion formed therewith which forms a portion of the housing assembly of the preferred embodiment of the present invention.

Turning first to the graphical representation of FIG. 1, the stress exerted upon a material is plotted as a function of strain. Stress ($\sigma$) is plotted on the ordinate axis 50 as a function of strain ($\epsilon$), a unitless value, on abscissa axis 54. Stress is a quantity scaled in terms of a unit of force over an area, such as pounds per square inch (lb/in$^2$).

Different materials exhibit different stress versus strain curves; plot 58 of FIG. 1 is representative of a thermoplastic material which has a large elastic region. The elasticity of a material is the ability of a material to return to its original shape subsequent to exertion of a deformation force upon the material. A deformation force is a force of a magnitude great enough to cause the material to become deformed. The elastic region of a stress v. strain curve is indicative of the range of forces (which is directly proportional to stress) which may be applied to a material and which does not cause permanent deformation thereof.

With respect to plot 58 of FIG. 1, the elastic region is that region of the plot in which strain is linearly related to the stress exerted upon the material. Such a region is located to the left-hand side of vertically extending line 62, shown in hatch.

When stress is exerted upon a material which exceeds the elasticity of the material (i.e., the stress exerted is beyond the elastic region), upon termination of the application of the stress to the material, the material does not return to its undeformed state (i.e., the material remains deformed). With respect to plot 58 of FIG. 1, such level of stress, referred to as the inelastic or plastic region, is indicated as those portions of plot 58 to the right-hand side of vertically extending line 62, shown in hatch.

To prevent permanent deformation of a material, the level of stress applied to a material must not be beyond that level which defines the elastic region of the material.

Application of stress (which is directly proportional to magnitude of force exerted upon the material) must not be great enough to exceed the elastic region of the material to prevent thereby permanent deformation of the material. The capability of a material to return to an undeformed position upon termination of application of a stress thereto, when in the elastic region, is advantageously utilized in the operation of the present invention.

Turning now to the perspective view of FIG. 2, a bottom half of the housing assembly of a preferred embodiment of the present invention, referred to generally by reference numeral 100, is shown. As a top half of housing assembly 100 is substantially identical to the illustrated bottom half of FIG. 2, it is noted at the outset that the top half of the housing assembly may be similarly described.

The bottom half of housing assembly 100 is generally cubular in nature and is comprised of bottom surface 106, left side wall 112, right side wall 118, rear side wall 124, and front side wall 130. Housing assembly 100 is operative to house, in supportive engagement therewithin, a circuit board, or some other similarly-shaped substrate, at a predetermined height above the bottom surface 106. As a circuit board typically contains circuit components and/or circuit paths disposed upon bottom surfaces thereof, the circuit board cannot be merely mounted upon the bottom surface of a housing, such as bottom surface 106. Therefore, the circuit board must be mounted at a level elevated above the bottom surface of the housing. Additionally, as previously described, use of threaded shaft members or standoffs to affix a circuit board to a housing is labor intensive, and use of such means of affixation also increases the likelihood of damage to the circuit board and/or housing assembly. Advantageously, the housing assembly of the preferred embodiment of the present invention obviates the need of such threaded shaft members or standoffs to house the circuit board in supportive engagement within the housing assembly.

Housing assembly 100 of FIG. 2 additionally includes raised shoulder portions 136 and 142 formed integral with bottom surface 106 and rear side wall 124. Shoulder portions 136 and 142 extend beyond the surfaces of bottom surface 106 and side wall 124.

Formed integral with right side wall 118 and bottom surface 106 are two rib members, each formed of top and bottom portions, and here indicated by reference numerals 148A and 148B, and 152A and 152B, respectively. Similarly, formed integral with left side wall 112 and bottom surface 106 are rib members 156 and 160. While not shown in the perspective view of FIG. 2, rib members 156 and 160 are comprised of top and bottom portions corresponding to top and bottom portions 148A, 148B, 152A, and 152B formed integral with right side wall 118. Such portions of rib members 156 and 160 will be indicated in succeeding Figures by reference numerals 156A-B and 160A-B.

Truncated cylindrical members 164, 168, and 172 are formed integral with bottom surface 106 to extend above surface 106. Cylindrical members 164-172 each define longitudinally-extending apertures therethrough. Additionally, formed integral with cylindrical members 164-172 are additional shoulder portions, here referenced by reference numerals 176, 180, and 184. Preferably, several shoulder portions 176-184 are formed integral with each of the respective cylindrical members, and spaced equidistantly about the circumferences defined by the cylindrical members. Top surfaces of shoulder portions 136, 142, 176, 180, and 184, as well as top surfaces of bottom portions 148B and 152B (and, additionally, top surfaces of bottom portions of rib members 156 and 160) are all disposed at similar elevations above bottom surface 106 of housing assembly 100.

Housing assembly 100 of FIG. 2 is further illustrated to include clip members 186 formed integral with right side wall 118 and clip members 188 formed integral with left side wall 112 to extend beyond a top surface thereof. Clip members 186-188 permit connection of the bottom portion of housing assembly 100 to the top portion of the housing assembly (not shown in perspective view of FIG. 2). Rear side wall 124 is shown to include a gapped portion defined by a length indicated by arrow 190. The gapped portion formed thereat forms an opening in side wall 124 permitting, in a preferred embodiment, mounting of a plug connector thereat. The perspective view of FIG. 2 further illustrates lips formed of top surfaces of side walls 112-130. The lips formed of the top surfaces of the side walls 112-130 permit mated engagement with corresponding lips formed upon side walls of a top portion (not illustrated) of the housing assembly 100.

Figures 3, 4:
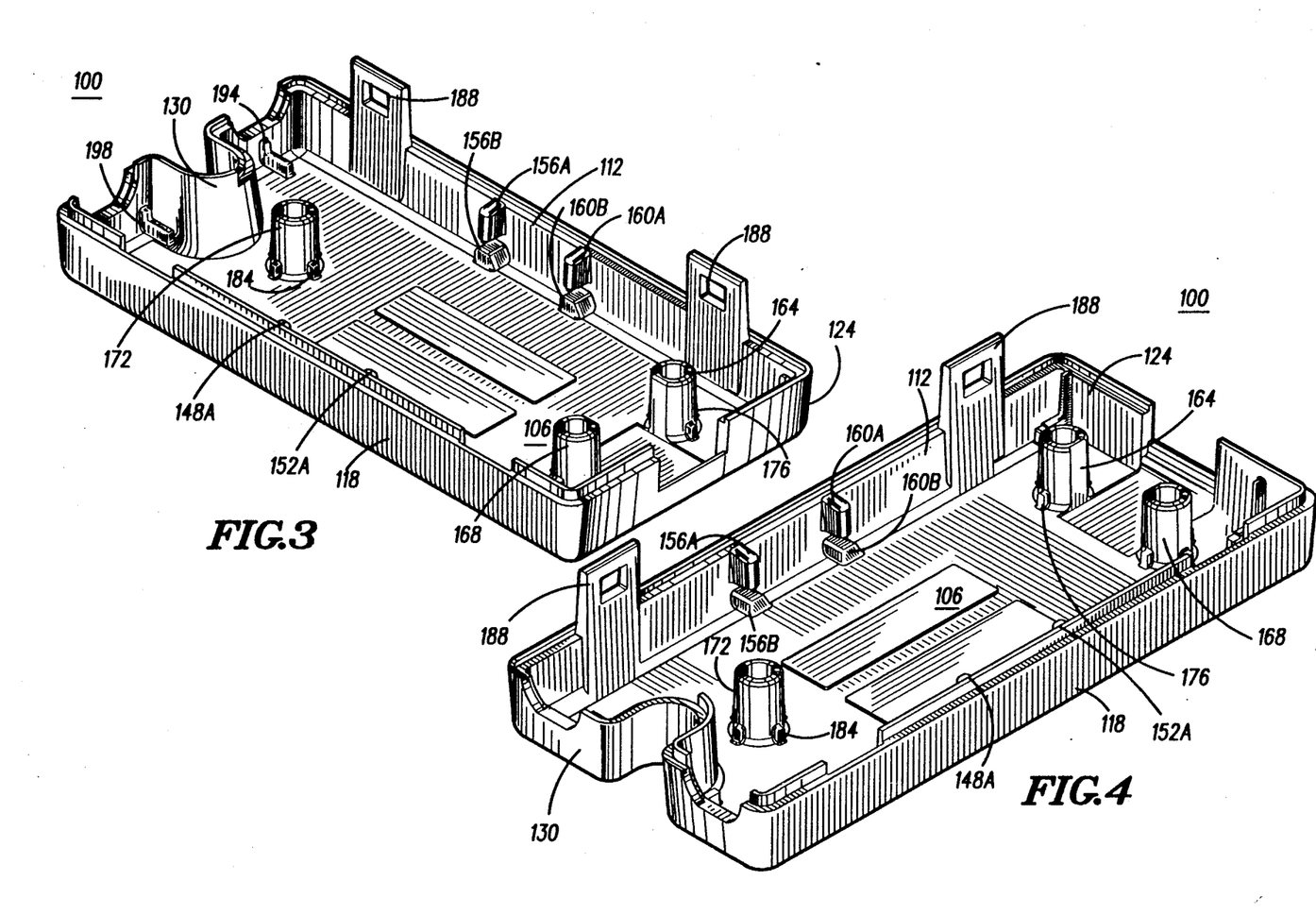
FIG. 3 is a perspective view, similar to that of FIG. 2, but taken from a second angle.
FIG. 4 is a perspective view, similar to those of FIGS. 2-3, but taken from a third angle.

FIG. 3 is a perspective view, similar to that of FIG. 2, of the bottom portion of housing assembly 100. The perspective view of FIG. 3 is, however, rotated relative to that of FIG. 2, such that the view is taken from behind rear side wall 124 of the bottom portion of assembly 100. Structure described hereinabove with respect to the perspective view of FIG. 2 is similarly numbered in FIG. 3, e.g., bottom surface 106, left and right side walls 112 and 118, rear and front side walls 124 and 130, top portions 148A and 152A of rib members formed integral with side wall 118 truncated cylindrical members 164, 168, and 172, shoulder portions 176 and 184 formed integral with cylindrical members 164 and 172, and clip members 188 formed integral with side wall 112 are all illustrated in the view of FIG. 3. Rib members 156 and 160 of FIG. 2 are shown in FIG. 3 to be formed of top and bottom portions, here referenced by reference numerals 156A-B and 160A-B.

Analogous to shoulder portions 136 and 142 formed integral with side wall 124 (illustrated only in the perspective view of FIG. 2), shoulder portions 194 and 198 are formed integral with side wall 130 and bottom surface 106. Top surfaces of shoulder portions of 194 and 198, as well as top surfaces of bottom portions 156B and 160B of the rib members formed integral with side wall 112, are disposed at elevations above bottom surface 106 similar to the elevations at which the top surfaces of shoulder portions 136 and 142, and top surfaces of rib member portions 156B and 160B are disposed above bottom surface 106.

FIG. 4 is another perspective view, similar to that of FIGS. 2-3, of the bottom portion of housing assembly 100, but taken from another angle. Structure described hereinabove with respect to the perspective views of FIGS. 2-3 is again similarly numbered in FIG. 4, and will not again be noted in detail.

Figure 5:
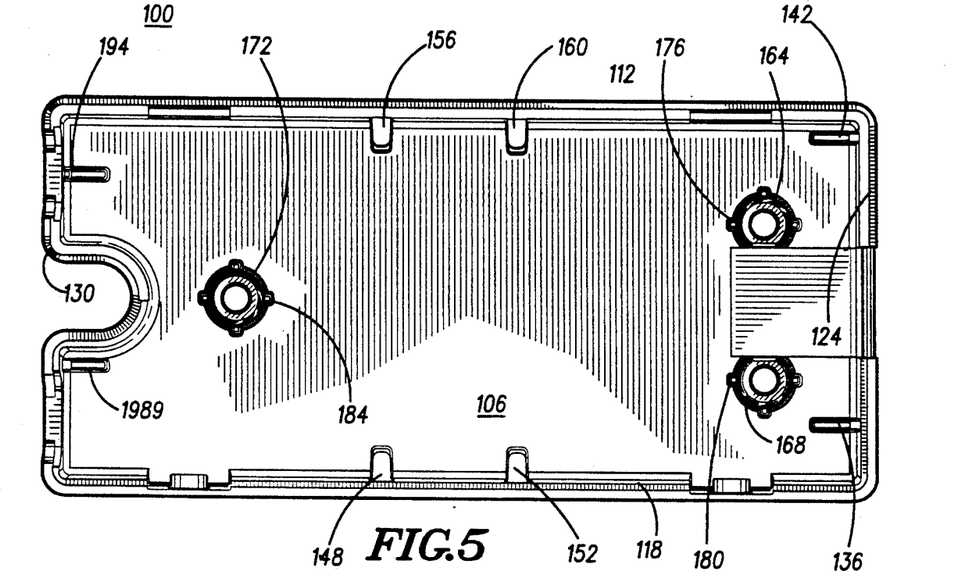
FIG. 5 is a plan view of the housing assembly of FIGS. 2-4.

FIG. 5 is a plan view of the bottom portion of housing assembly 100 of FIGS. 2-4. Reference numerals previously utilized are again recited to indicate the structure of the bottom portion of housing assembly 100. A support surface formed of top surfaces of shoulder portions 136, 142, 176, 180, 184, 194, and 198 may best be seen in this plan view of FIG. 5. As the top surfaces of the shoulder portions are disposed at similar elevations above bottom surface 106, the support surface defined by the top surfaces of the shoulder portions (and also the top surfaces of bottom portions of rib members 148-160) define a planar support surface.

Turning now to the enlarged, cutaway view of FIG. 6A, shoulder portion 198 is shown in greater detail. As mentioned previously, shoulder portion 198 is formed integral with side wall 130 and bottom surface 106, and includes a top surface, here indicated by reference numeral 198A, which forms a portion of a support surface suitable for placement of a circuit board thereupon. Preferably, and as illustrated, edges which define the surfaces of shoulder portion 198 are rounded.

The enlarged, cut away view of FIG. 6B is similar to that of FIG. 6A, but illustrates shoulder portion 136 in greater detail. A top surface of shoulder 136 forms a bifurcated top surface forming a stepped surface formed of first and second surface portions 136A and 136B interconnected by surface portion 136C. Surface portion 136A is at an elevation above the surface of bottom surface 106 slightly greater than the elevation above surface 106 of surface portion 136B. In the preferred embodiment of the present invention, upon positioning of a circuit board upon the support surface formed of the bottom portion of housing assembly 100, the circuit board rests against surface portion 136A. At such initial position, the circuit board is considered to be at an "unlocked position". Sliding translation is permitted of the circuit board to position the circuit board such that the circuit board rests against surface portion 136B. At such position, for reasons to be described hereinbelow, the circuit board is considered to be at a "locked position".

FIG. 7 is an enlarged, cutaway view of truncated cylindrical member 168 illustrated in greater detail. As noted previously, shoulder portions 180 are formed integral with the cylindrical member 168. The longitudinally extending aperture which extends through cylindrical member 168 defines an opening, indicated by reference numeral 168A at a top surface thereof. A top surface of shoulder portion 180, here indicated by reference numeral 180A, is disposed at an elevation above bottom surface 106 which together with the top surfaces of shoulder portions 136 and 142, and 194-198 form a support surface for receiving a circuit board thereupon. Portions of other shoulder portions 180 formed integral with cylindrical member 168 are also noted in the figure.

Figure 8:
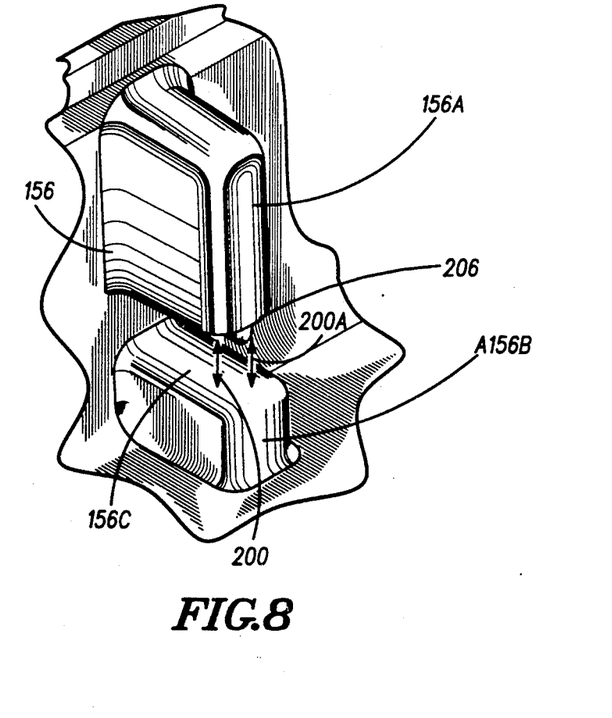
FIG. 8 is an enlarged, cutaway view of a single rib member which forms a portion of the housing assembly of the preferred embodiment of the present invention.

FIG. 8 is an enlarged, cutaway view of rib member 156 illustrated in greater detail. As mentioned previously, the rib members are comprised of top portion 156A and bottom portion 156B. Top portion 156A is formed integral with side wall 112, and bottom portion 156B is formed integral with both side wall 112 and the bottom surface 106 of the bottom portion of the housing assembly.

Top surface 156C of bottom portion 156B is formed at an elevation above bottom surface 106 corresponding to the elevations at which top surfaces of shoulder portions 136-142, 176-184, and 194-198 are disposed above bottom surface 106. A gap of a length indicated by the length of arrow 200 forms a separation distance which separates a bottom surface of top portion 156A and top surface 156C of bottom portion 156B.

Formed integral with top portion 156A of the rib member is clamp 206 which extends into the gap separating top portion 156A and bottom portion 156B. Clamp 206, in the preferred embodiment, is comprised of a thermoplastic material capable of elastic deformation.

Figure 9:
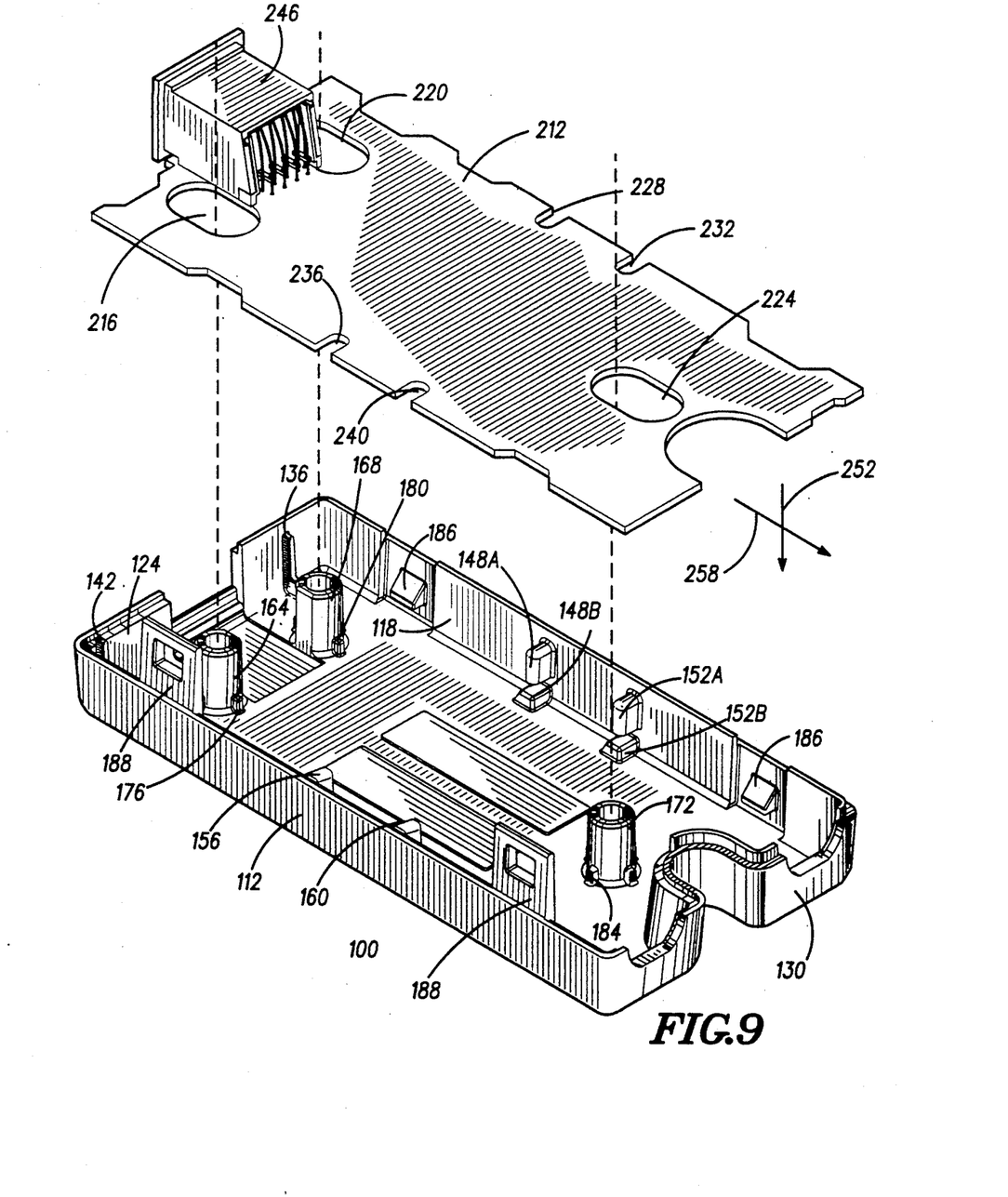
FIG. 9 is a perspective view of a circuit board positioned above the housing assembly of FIGS. 2-8.

Turning now to the exploded view of FIG. 9, a circuit board, indicated by reference numeral 212, is positioned above the bottom portion of housing assembly 100.

The length of circuit board 212 is slightly less than the length of the bottom portion of housing assembly 100. Because of the smaller size of circuit board 212, when positioned upon the support surface formed of the bottom portion of housing assembly 100, limited translation of circuit board 212 is permitted thereupon. Openings 216, 220, and 224 are formed to extend through circuit board 212, and are arranged to correspond in configuration with truncated cylindrical members 164–172 to permit insertion of cylindrical members 164–172 through openings 216–224 when the circuit board 212 is lowered upon the support surface formed of the bottom portion of housing assembly 100.

Similarly, grooves 228, 232, 236, and 240 formed at side portions of the circuit board 212 correspond in dimension to dimensions of rib members 148–160 also to permit lowering of the circuit board 212 upon the support surface formed of the bottom portion of housing assembly 100. Circuit board 212 further has mounted thereupon a plug connector 246. While not illustrated, a circuit may be disposed upon circuit board 212, as is conventional.

Because openings 216–224 correspond in number, and are aligned with truncated cylindrical members 164–172, and grooves 228–240 correspond in number and are aligned with rib members 148–160, circuit board 212 may be positioned upon the support surface formed of the bottom portion of housing assembly 100 by lowering of the circuit board 212 in the direction indicated in the Figure by arrow 252. As will be described hereinbelow, once circuit board 212 is lowered to be supported upon the support surface formed of the bottom portion of housing assembly 100, sliding translation of circuit board 212 upon the support surface in the direction indicated in the Figure by arrow 258, causes translation of circuit board 212 from an initial, unlocked position to a final, locked position whereat the circuit board 212 is clamped in fixed engagement with the bottom portion of the housing assembly.

Figure 10:
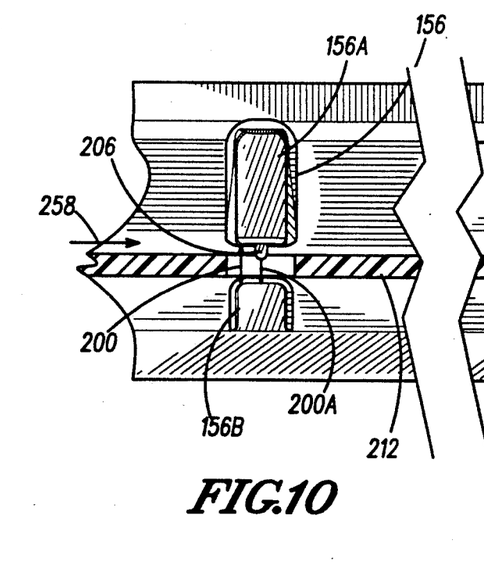
FIG. 10 is an enlarged, cutaway view illustrating the relationship between a clamp forming a portion of the housing assembly of the preceding Figures and a circuit board positioned at an unlocked position prior to affixation thereof to the housing assembly.

FIG. 10 is an enlarged, cutaway view illustrating the relationship between a rib member, such as rib member 156, clamp member 206, and circuit board 212. FIG. 10 illustrates positioning of the circuit board 212 as the circuit board is initially positioned at an unlocked position upon initial placement thereof upon the support surface formed of a bottom portion of the housing assembly 100. Prior to lowering of circuit board 212 upon the support surface, grooves 228–240 are aligned with rib members 148–160. Therefore, upon initial positioning of the circuit board upon the support surface, the circuit board does not rest upon a top surface, such as here, top surface 156C of the bottom portion of the rib member. Circuit board 212 initially rests only upon shoulder portions 136–142, 176–184, and 194–198 (not shown in FIG. 10). Arrow 200 again indicates the distance separating top and bottom portions 156A-B forming rib member 156. Arrow 200A additionally illustrates the distance separating clamp 206 and a top surface of bottom portion 156B of the rib member. The length indicated by arrow 200 is at least as great as the width of the circuit board 212, and the length indicated by arrow 200A is slightly less than the length of the circuit board 212.

Figure 11:
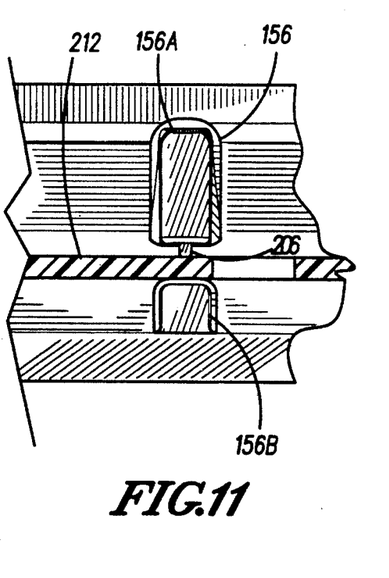
FIG. 11 is an exploded, cutaway view, similar to that of FIG. 10, but illustrating the circuit board clamped in position at the locking position by the clamp of the housing assembly.

Sliding translation of the circuit board 212 in the direction indicated by arrow 258 positions the circuit board 212 at a locking position to maintain the circuit board in a fixed engagement with the housing assembly. FIG. 11 is an enlarged, cutaway view, similar to that of FIG. 10, but illustrating the circuit board maintained in the fixed engagement with the housing assembly when positioned at the locking position.

When the circuit board is translated in the direction indicated by arrow 258, force is exerted upon clamp 206 to elastically deform the clamp thereby. Forces exerted by the clamp 206 responsive to such force causing the elastic deformation forms clamping forces for clamping the circuit board 212 in position, as illustrated in FIG. 11. The clamping forces exerted by each of the clamps 206 formed upon each of the rib members 148–160 maintain the circuit board 212 in the fixed engagement with the housing assembly.

Figures 12, 13:
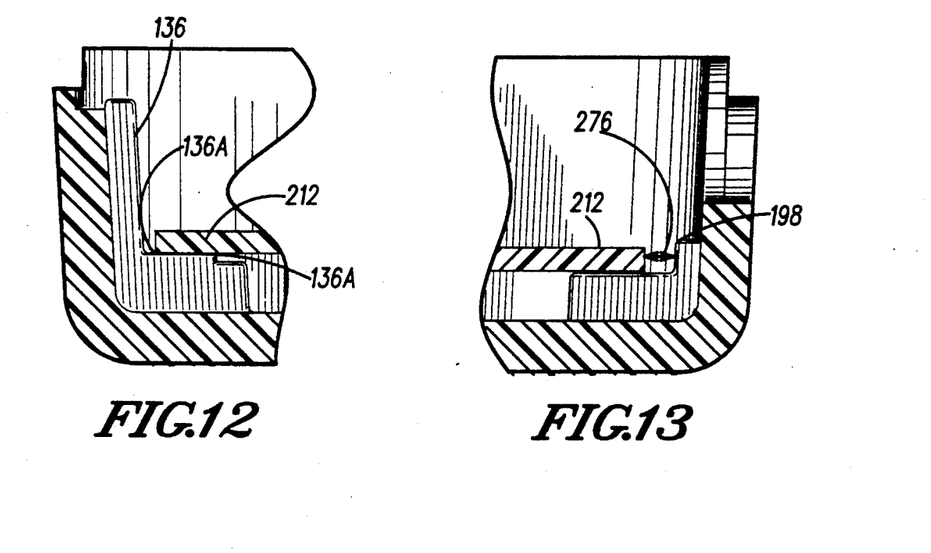
FIG. 12 is an enlarged, cut away view of a portion of the housing assembly and of a circuit board illustrating the relationship between the circuit board and a shoulder portion forming the support surface of the housing assembly when the circuit board is positioned at the unlocked position.
FIG. 13 is an enlarged, cutaway view illustrating the relationship between a shoulder portion of the housing assembly formed at a second side of the housing assembly and the circuit board when the circuit board is positioned at the unlocked position.

FIG. 12 is a cutaway, enlarged view of shoulder portion 136 and the relationship thereof with circuit board 212 upon initial positioning of the circuit board upon the support surface at the unlocked position. Circuit board 212 rests against the upper surface portion, here surface portion 136A of the bifurcated surface formed of the shoulder portion 136.

FIG. 13 is an enlarged, cutaway view illustrating the relationship between shoulder portion 198 and a second side of circuit board 212 when the circuit board is initially positioned at the unlocked position. It is noted that sliding translation is permitted of circuit board 212 along a length indicated by arrow 276.

Figures 14, 15:
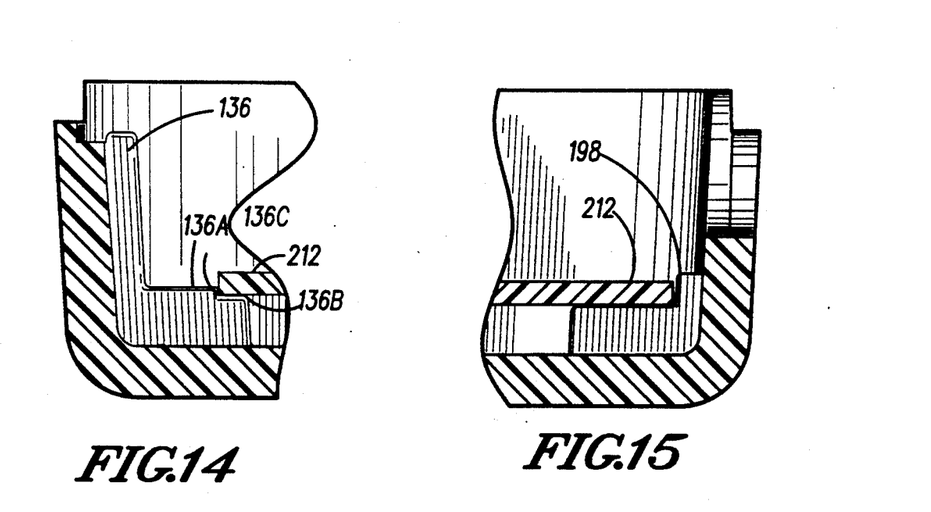
FIG. 14 is an enlarged, cutaway view, similar to that of FIG. 12, but illustrating the relationship between the circuit board and the shoulder portion forming the support surface of the housing assembly when the circuit board is translated to the locking position.
FIG. 15 is an enlarged, cutaway view, similar to that of FIG. 14, but illustrating the relationship between the circuit board and a shoulder portion formed at a second side of the housing assembly when the circuit board is positioned at the locked position.

FIG. 14 is an enlarged, cutaway view, similar to that of FIG. 12, but illustrating the relationship between the circuit board 212 and shoulder portion 136 when the circuit board is positioned at the locked position to be held in the fixed engagement with the housing assembly. When the circuit board is affixed in position at the locking position, circuit board 212 is seated upon surface 136B. An edge of circuit 212 is additionally seated against surface 136C of shoulder portion 136.

FIG. 15 is an enlarged, cutaway view, similar to that of FIG. 13, but illustrating the relationship between circuit board 212 and shoulder portion 198 when the circuit board is affixed in position at the locking position.

Because the circuit board may be maintained in fixed engagement with the housing assembly by merely aligning the grooves and openings formed through the circuit board with corresponding structure formed upon the housing assembly, lowering the housing assembly upon the support surface formed of the housing assembly, and translating the circuit board to cause elastic deformation of clamps 206 formed integral with respective ones of the rib members 148–160, no threaded fasteners are required to maintain the circuit board in the fixed engagement with the housing assembly.

Figure 16:
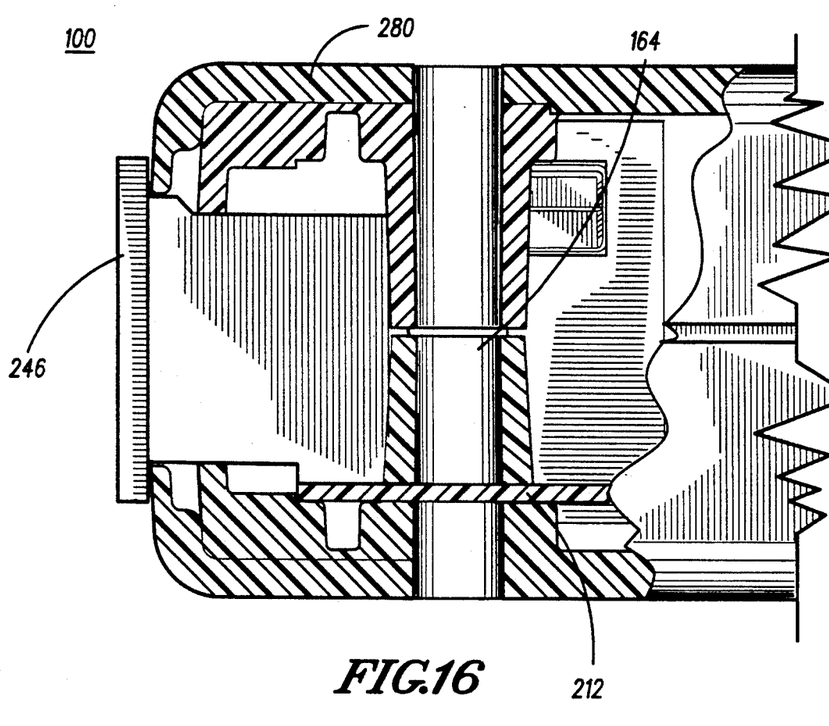
FIG. 16 is a cutaway view of the housing assembly of the present invention in which a circuit board is affixed in supportive engagement at a locked position therewithin.

Turning finally now to the cutaway view of FIG. 16, the circuit board 212 is illustrated in supportive engagement by way of fixed engagement upon bottom portion of housing assembly 100. A portion of a top portion of housing assembly 100, here indicated by reference numeral 280, is additionally illustrated in the figure. As mentioned previously, the top portion and the bottom portion are substantially identical, but top portion 280 here primarily is operative to form a top surface for totally enclosing the circuit board 212 when the circuit board 212 is positioned therewithin. As top portion 280 is substantially identical to that of the bottom portion, top portion 280 additionally contains side walls having lips for mated engagement with corresponding side walls of the bottom portion of the housing assembly.

Top portion 280 of the housing assembly is further illustrated to have truncated cylindrical members which correspond to the truncated cylindrical members 164–172 of the bottom portion thereof. The truncated cylindrical members of the top and bottom portions of the housing assembly are mated to permit fasteners to extend therethrough. Additionally, clip members 186 and 188 maintain the top and bottom portions of the housing assembly in abutting engagement therebetween. Plug member 246 is additionally illustrated in position extending through the gap to find by arrow 190 of FIG. 2. Because no threaded shaft members are required to affix the circuit board in position in supportive engagement within the housing assembly 100, the assembly time required to assemble the circuit board and housing assembly is reduced.

While the present invention has been described in connection with the preferred embodiment shown in the various figures, it is to be understood that other similar embodiments may be used and modifications and additions may be made to the described embodiment for performing the same function of the present invention without deviating therefrom. Therefore, the present invention should not be limited to any single embodiment, but rather construed in breadth and scope in accordance with the recitation of the appended claims.

I claim:

1. A housing assembly for supportively housing a substrate in fixed engagement at a predetermined distance above a bottom surface thereof, said housing assembly having:
    means forming a support surface for receiving the substrate thereupon, the support surface formed thereby of dimensions permitting limited sliding translation of the substrate when positioned thereupon between an unlocked position and a locked position;
    means forming at least one rib member for aligning the substrate with the support surface for positioning of the substrate at the unlocked position upon initial positioning of the substrate upon the support surface; and
    means forming a clamp for clamping the substrate in said fixed engagement when the substrate is translated to the locked position, the clamp formed thereby being comprised of a material capable of elastic deformation whereby such that the translation of the substrate to the locking position exerts compressive forces against the clamp to elastically deform the clamp thereby, whereby forces exerted by the clamp, once elastically deformed, form clamping forces for fixedly engaging the substrate to the housing assembly.

2. The housing assembly of claim 1 further comprising at least one housing wall having raised shoulder portions disposed to extend beyond a surface thereof.

3. The housing assembly of claim 2 wherein said support surface is formed of top surfaces of said raised shoulder portions.

4. The housing assembly of claim 3 wherein at least one of the top surfaces of the raised shoulder portions forms a bifurcated top surface comprising a stepped surface comprised of a first planar surface portion and a second planar surface portion interconnected by a third planar surface portion, with said first planar surface portion disposed at an elevation above the housing wall greater than a corresponding elevation above the housing wall of the second planar surface portion.

5. The housing assembly of claim 4 wherein the unlocked position includes the first planar surface portion of the at least one bifurcated top surface such that, when the substrate is positioned upon the support surface at the unlocked position, the substrate abuts against the first planar surface portion of the at least one bifurcated top surface.

6. The housing assembly of claim 4 wherein the locked position includes the second planar surface portion of the at least one bifurcated top surface such that, when the substrate is positioned upon the support surface at the locked position, the substrate abuts against the second planar surface portion of the at least one bifurcated top surface.

7. The housing assembly of claim 1 further comprising at least one housing side wall having the at least one rib member formed of the means for aligning disposed thereupon.

8. The housing assembly of claim 7 wherein a longitudinal axis of the at least one rib member extends in a direction at an angle relative to a plane defined by the support surface.

9. The housing assembly of claim 8 wherein the at least one rib member is of dimensions permitting mated engagement with a corresponding at least one groove formed in the substrate.

10. The housing assembly of claim 9 wherein the substrate is positioned at the unlocked position by vertically translating the substrate in a direction defined by the longitudinal axis of the at least one rib member.

11. The housing assembly of claim 8 wherein the at least one rib member is comprised of a top portion and a bottom portion, said top and bottom portions, respectively, positioned in tandem, and separated by a separation distance forming a gap.

12. The housing assembly of claim 11 wherein a top surface of the bottom portion of the at least one rib member forms a portion of the support surface.

13. The housing assembly of claim 11 wherein the clamp formed by said means for clamping is formed upon a bottom surface of the top portion of the at least one rib member.

14. The housing assembly of claim 13 wherein the clamp is formed integral with the top portion of the at least one rib member.

15. The housing assembly of claim 13 wherein the clamp is positioned to extend into the gap separating the top and bottom portions of the at least one rib member.

16. The housing assembly of claim 15 wherein the clamp is comprised of a material capable of elastic deformation.

17. The housing assembly of claim 16 wherein sliding translation of the substrate between the unlocked position and the locked position exerts compressive forces against the clamp to elastically deform the clamp thereby whereby forces exerted by the clamp, once elastically deformed, form clamping forces for fixedly engaging the substrate to the housing assembly.

18. The housing assembly of claim 1 further comprising means for limiting the sliding translation permitted of the substrate upon the support surface beyond positions defined by the unlocked position and the locked position.

19. A housing assembly for supportively housing a circuit board in fixed engagement at a predetermined distance above a bottom surface thereof, said housing assembly having:
a housing bottom wall defining the bottom surface;
a plurality of raised shoulder portions formed integral with the housing bottom wall and disposed to extend above the surface thereof, said plurality of raised shoulder portions having top surfaces which form a support surface for receiving the circuit board thereupon and for permitting limited sliding translation of the circuit board, once positioned thereupon, between an unlocked position and a locked position;
housing side walls formed integral with said housing bottom wall and extending upwardly therefrom, said housing side walls having longitudinal axes extending in directions corresponding to directions of translation permitted of the circuit board upon the support surface;
at least one rib member formed upon each of the housing side walls, said rib members having longitudinal axes extending in directions at angles relative to a plane defined by the support surface, each of the rib members of dimensions permitting mated engagement with corresponding grooves formed in the circuit board, and formed of a top portion and a bottom portion, said top and bottom portions, respectively, of each rib member separated by separation distances forming gaps;
a clamp formed integral with each rib member, each of said clamps comprised of elastically-deformable material and positioned to extend into the gaps separating the top and bottom portions of the rib members such that the sliding translation of the circuit board along the support surface to the locking position exerts compressive forces against each of the clamps to elastically deform the clamps thereby, such the forces exerted by the clamps, once elastically deformed, form clamping forces for fixedly engaging the circuit board to the housing assembly.

20. An apparatus for supporting an electrical circuit, said apparatus comprising:
an electrical circuit board for supporting the electrical circuit thereupon, said electrical circuit board having a plurality of notches formed into side portions thereof; and
a housing for affixing the electrical circuit board in position at a predetermined distance above a bottom surface thereof, said housing assembly having: a housing bottom wall defining the bottom surface, and a plurality of raised shoulder portions formed integral with the housing bottom wall and disposed to extend above the surface thereof, said plurality of raised shoulder portions having top surfaces which together form a support surface for receiving the circuit board thereupon and for permitting limited sliding translation of the circuit board, once positioned thereupon, between an unlocked and a locked position; housing side walls formed integral with said housing bottom wall and extending upwardly therefrom, said housing side walls having longitudinal axes extending in directions corresponding to directions of translation permitted of the circuit board upon the support surface, and at least one rib member formed upon each of the housing side walls, said rib members having longitudinal axes extending in directions at angles relative to a plane defined by the support surface, each of the rib members of dimensions permitting mated engagement with said notches formed in the circuit board, and formed of a top portion and a bottom portion, said top and bottom portions, respectively, of each rib member separated by separation distances forming gaps; and a clamp formed integral with each rib member, each of said clamps comprised of elastically-deformable material and positioned to extend into the gaps separating the top and bottom portions of the rib members such that the sliding translation of the circuit board along the support surface to the locking position exerts compressive forces against each of the clamps to elastically deform the clamps thereby, such the forces exerted by the clamps, once elastically deformed, for clamping forces for fixedly engaging the circuit board to the housing assembly.

21. A housing assembly for supportively housing a substrate in fixed engagement at a predetermined distance above a bottom surface thereof, said housing assembly comprising:
at least one housing wall having raised shoulder portions disposed to extend beyond a surface thereof, with each of the raised shoulder portions defining top surfaces thereupon, wherein the top surface of at least one of the raised shoulder portions forms a bifurcated top surface comprised of a stepped surface having a first planar surface portion and a second planar surface portion interconnected by a third planar surface portion, with said first planar surface portion disposed at an elevation above the housing wall greater than a corresponding elevation above the housing wall of the second planar surface portion, whereby the top surfaces of the raised shoulder portions define a support surface for receiving the substrate thereupon, the support surface formed thereby being of dimensions permitting limited sliding translation of the substrate when positioned thereupon between an unlocked position and a locked position;
means forming at least one rib member for aligning the substrate with the support surface for positioning of the substrate at the unlocked position upon initial positioning of the substrate upon the support surface; and
means forming a clamp for clamping the substrate in said fixed engagement when the substrate is translated to the locked position.

22. A housing assembly for supportively housing a substrate in fixed engagement at a predetermined distance above a bottom surface thereof, said housing assembly having:
means forming a support surface for receiving the substrate thereupon, the support surface formed thereby of dimensions permitting limited sliding translation of the substrate when positioned thereupon between an unlocked position and a locked position;
at least one housing sidewall having at least one rib member extending in a direction at an angle relative to a plane defined by the support surface formed thereupon, a longitudinal axis of said at least one rib member for aligning the substrate with the support surface for positioning of the substrate at the unlocked position upon initial positioning of the substrate upon the support surface; and
means forming a clamp for clamping the substrate in said fixed engagement when the substrate is translated to the locked position.

* * * * *